United States Patent
Karnes

(10) Patent No.: US 6,449,171 B1
(45) Date of Patent: Sep. 10, 2002

(54) TELECOMMUNICATIONS MODULAR CARDHOLDER WITH INTEGRAL HANDLE

(75) Inventor: Joshua D. Karnes, Leander, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/751,753

(22) Filed: Dec. 29, 2000

(51) Int. Cl.[7] .............................. H05K 7/14; H05K 9/00
(52) U.S. Cl. ...................... 361/796; 361/728; 361/753; 361/798; 361/800; 361/816; 211/41.17; 16/110.1
(58) Field of Search ................................ 361/752, 753, 361/728, 796, 797–800, 814, 816; 16/110.1, 405, 408–410, 429; 174/35 R; 211/41.17

(56) References Cited

U.S. PATENT DOCUMENTS

| | | | | |
|---|---|---|---|---|
| 4,466,679 A | * | 8/1984 | St. Germain et al. | .... 174/138 F |
| 5,845,978 A | * | 12/1998 | Jung | ............................ 16/405 |
| 6,076,296 A | * | 6/2000 | Schaeffer | ...................... 40/649 |
| 6,101,372 A | * | 8/2000 | Kubo | .......................... 155/910 |
| 6,244,400 B1 | * | 6/2001 | Bowers | ........................ 150/111 |

* cited by examiner

Primary Examiner—Jayprakash N. Gandhi
(74) Attorney, Agent, or Firm—Baker Botts L.L.P.

(57) ABSTRACT

A method for forming a telecommunications modular cardholder comprises providing a generally flat workpiece; cutting a handle in the workpiece while leaving the handle attached to the workpiece; and forming a front portion from the workpiece. The front portion is substantially perpendicular to a body portion of the workpiece. The front portion and the body portion of the workpiece form a modular face plate. The method also includes bending the handle with respect to the workpiece and the front portion to form a handle facing a desired direction.

26 Claims, 7 Drawing Sheets

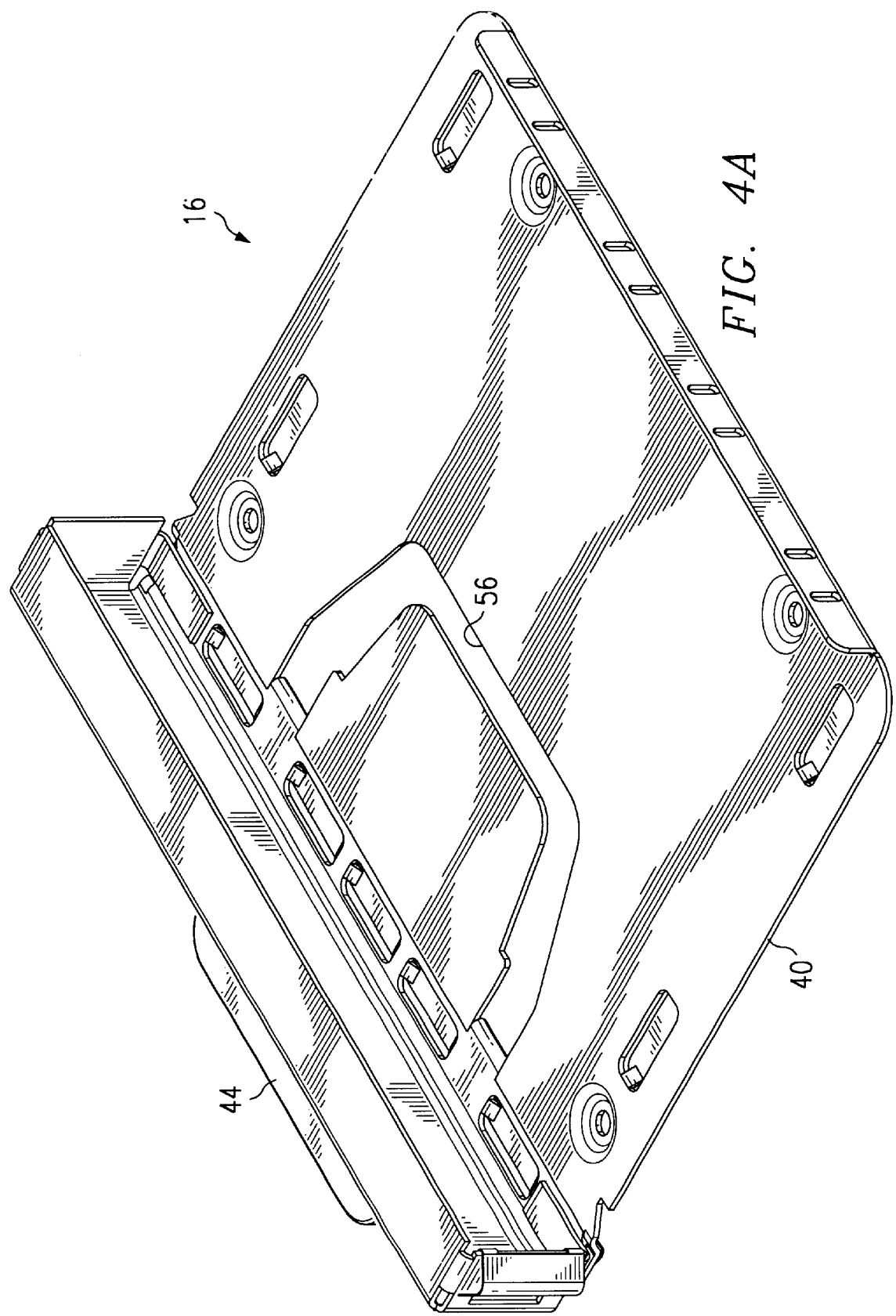

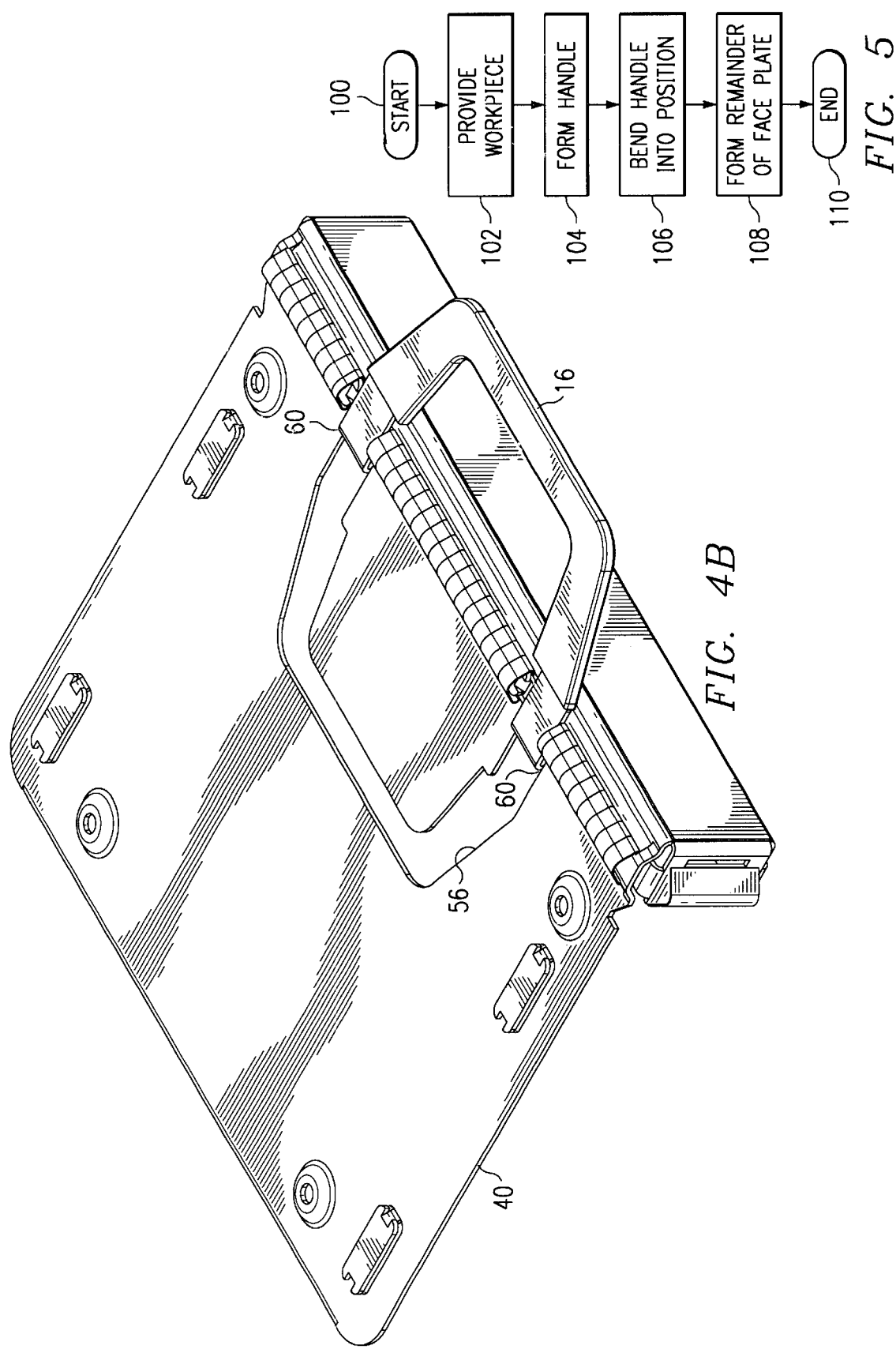

TELECOMMUNICATIONS MODULAR CARDHOLDER WITH INTEGRAL HANDLE

TECHNICAL FIELD OF THE INVENTION

This invention relates generally to computer and telecommunications equipment hardware and more particularly to a telecommunications modular cardholder with an integral handle.

BACKGROUND OF THE INVENTION

Telecommunications is becoming increasingly important in today's society. In particular, digital communications spurred by the Internet creates a need for improved telecommunications systems. As a result, improvements continue to be made. For example, digital subscriber lines (DSL) are becoming increasingly popular. Many of the improvements are implemented through semiconductor devices stored on printed circuit boards. Each circuit board generally forms a part of a larger sub-component. For example, a DSLAM includes a plurality of central office modems.

Many products, including such DSLAMs, in the telecommunications industry employ a modular construction that, for example, might involve a chassis or "cardcage" into which different cards may be installed by an operator to form the full assembly. Generally the cards are constructed with a sheet-metal (face plate) part that is affixed to the card to form a complete "card" assembly. The "faceplate", or modular cardholders of each card engages with that of the other cards in order to form the front panel of the whole assembly.

It is generally necessary for the cards to employ some type of handle that facilitates extraction of the card from the assembly. Generally, this handle is a separate hardware element that attaches to the face plate. The addition of the handle hardware, the space to attach it to the faceplate, and the costs of the associated labor make this traditional handle an unfavorable necessity.

SUMMARY OF THE INVENTION

Accordingly, a need has arisen for a telecommunications modular cardholder with integral handle. The present invention provides a telecommunications modular cardholder with integral handle that addresses shortcomings of prior systems and methods.

According to one embodiment of the invention, a telecommunications modular cardholder includes a generally rectangular body portion configured to affix to and secure a printed circuit board The generally rectangular body portion is formed from a workpiece and configured to fit in a slot. A front end portion of the cardholder is formed at a first end of the body portion. The front end portion is generally rectangular and disposed in a plane generally perpendicular to the body portion. A handle extends from the generally rectangular body portion. The handle is formed integral with the body portion and formed from the workpiece.

According to another embodiment of the invention, a method for forming a telecommunications modular cardholder includes: providing a generally flat workpiece; cutting a handle in the workpiece while leaving the handle attached to the workpiece; and forming a front portion from the workpiece. The front portion is substantially perpendicular to a body portion of the workpiece. The front portion and the body portion of the workpiece form a modular face plate. The method also includes bending the handle with respect to the workpiece and the front portion to form a handle facing a desired direction.

Embodiments of the invention provide numerous technical advantages. For example, some embodiments of the present invention allow construction of a modular cardholder with an integral handle that may be formed in an inexpensive manner. In particular, a modular cardholder may be formed by cutting the handle in sheet metal that also forms the cardholder and bending the handle back to a desired position. Doing so avoids costly hardware and avoids additional space requirements for the resulting handle. Additionally, apertures that would otherwise be needed to affix the handle to the faceplate of the cardholder are not required, reducing electromagnetic interference that may emanate from the attached printed circuit board.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which:

FIG. 4A is an isometric drawing of the modular cardholder of FIG. 1 after the handle has been bent to the desired position;

FIG. 4B is a schematic diagram of the modular cardholder of FIG. 4A showing the back side of the cardholder; and FIG. 5 is a flow chart showing a method for forming a modular cardholder according to the teachings of the invention.

DETAILED DESCRIPTION OF THE INVENTION

Embodiments of the present invention and its advantages are best understood by referring to FIGS. 1 through 5 of the drawings, like numerals being used for like and corresponding parts of the various drawings.

Figure 1:
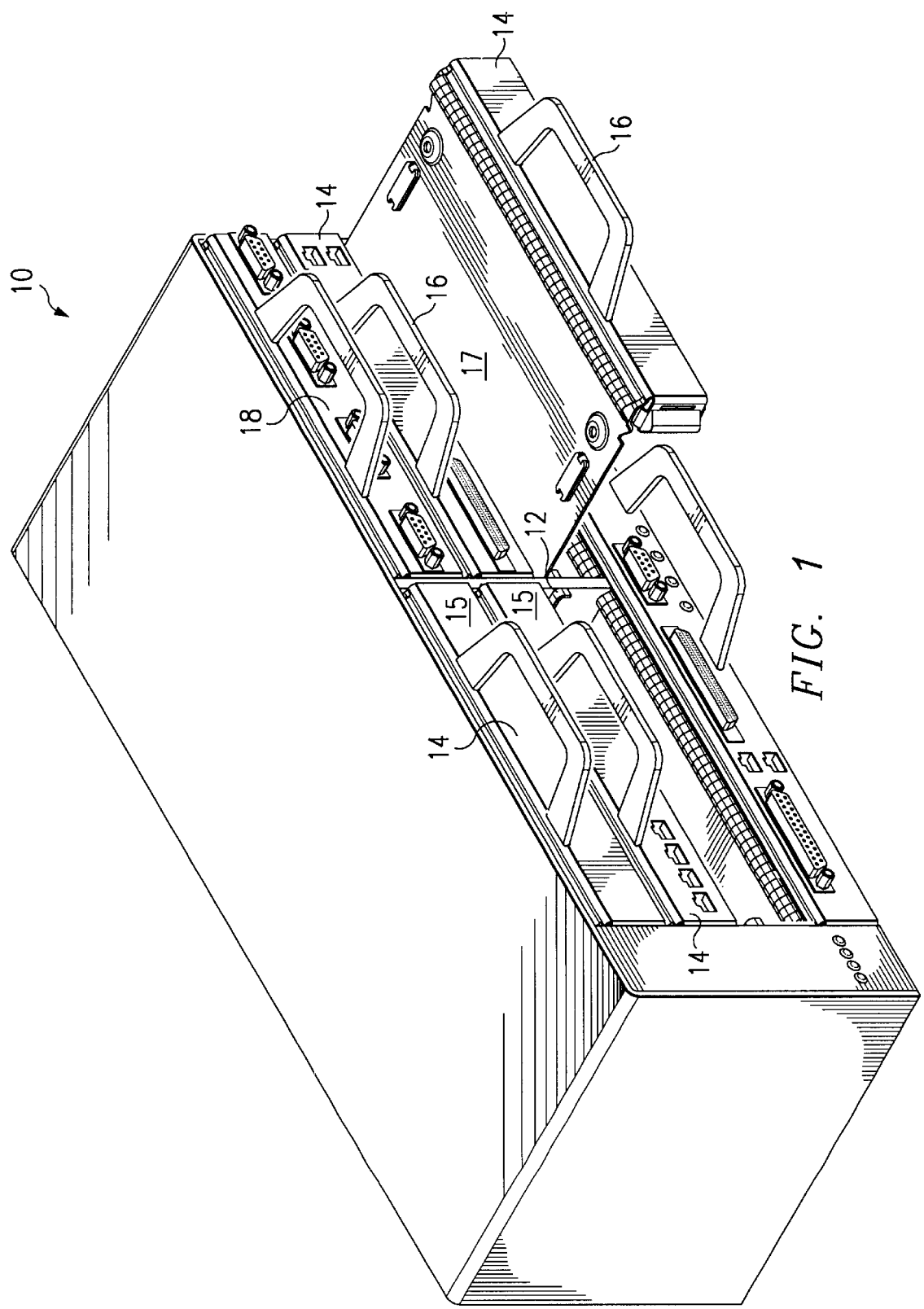
FIG. 1 is a schematic drawing of a telecommunications chassis that includes a plurality of modular cardholders with handles constructed according to the teachings of the invention.

FIG. 1 is a schematic drawing of a telecommunications chassis 10. Telecommunications chassis 10 includes a plurality of modular cardholders 14, also known as faceplates, having handles 16. Modular cardholders 14 fit into slots 12 in telecommunications chassis 10.

Modular cardholders 14 generally hold an associated printed circuit board 18, and in this embodiment, do so in a horizontal fashion; however, a vertical configuration may also be used. Printed circuit boards 18 combine to perform a plurality of functions associated with telecommunications chassis 10. One example of telecommunications chassis 10 is a digital subscriber line access multiplexer (DSLAM), and one example of the printed circuit board 18 is a DSL modem.

Handles 16 on modular cardholders 14 facilitate extraction of modular cardholder 14 from, and insertion of modular cardholder 14 into, slots 12 of chassis 10. Modular cardholders 14 conventionally include a front portion 15 and a body portion 17.

Figure 2A:
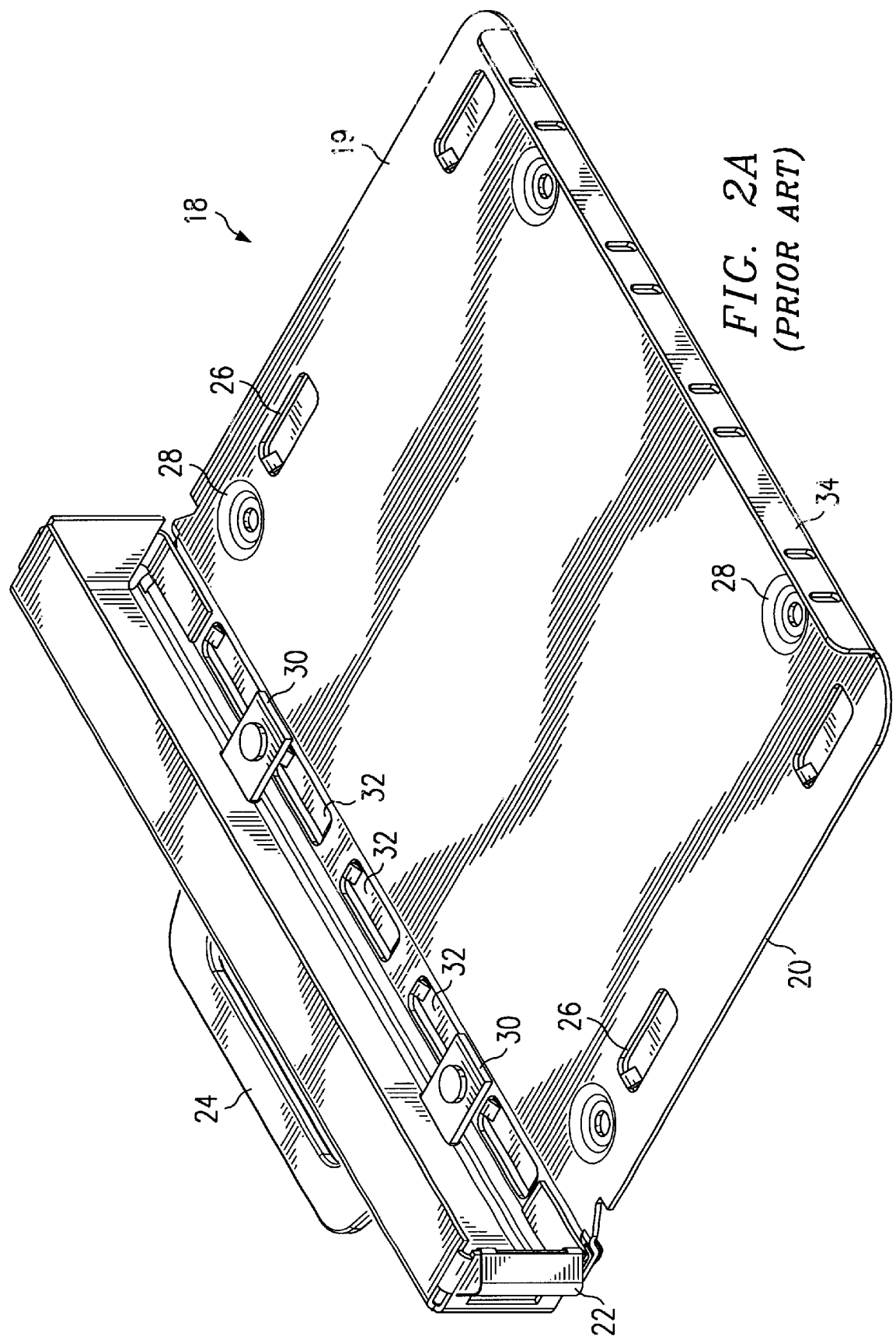
FIG. 2A is an isometric drawing of a traditional cardholder constructed according to conventional techniques, showing a first side of the cardholder.
Figure 2B:
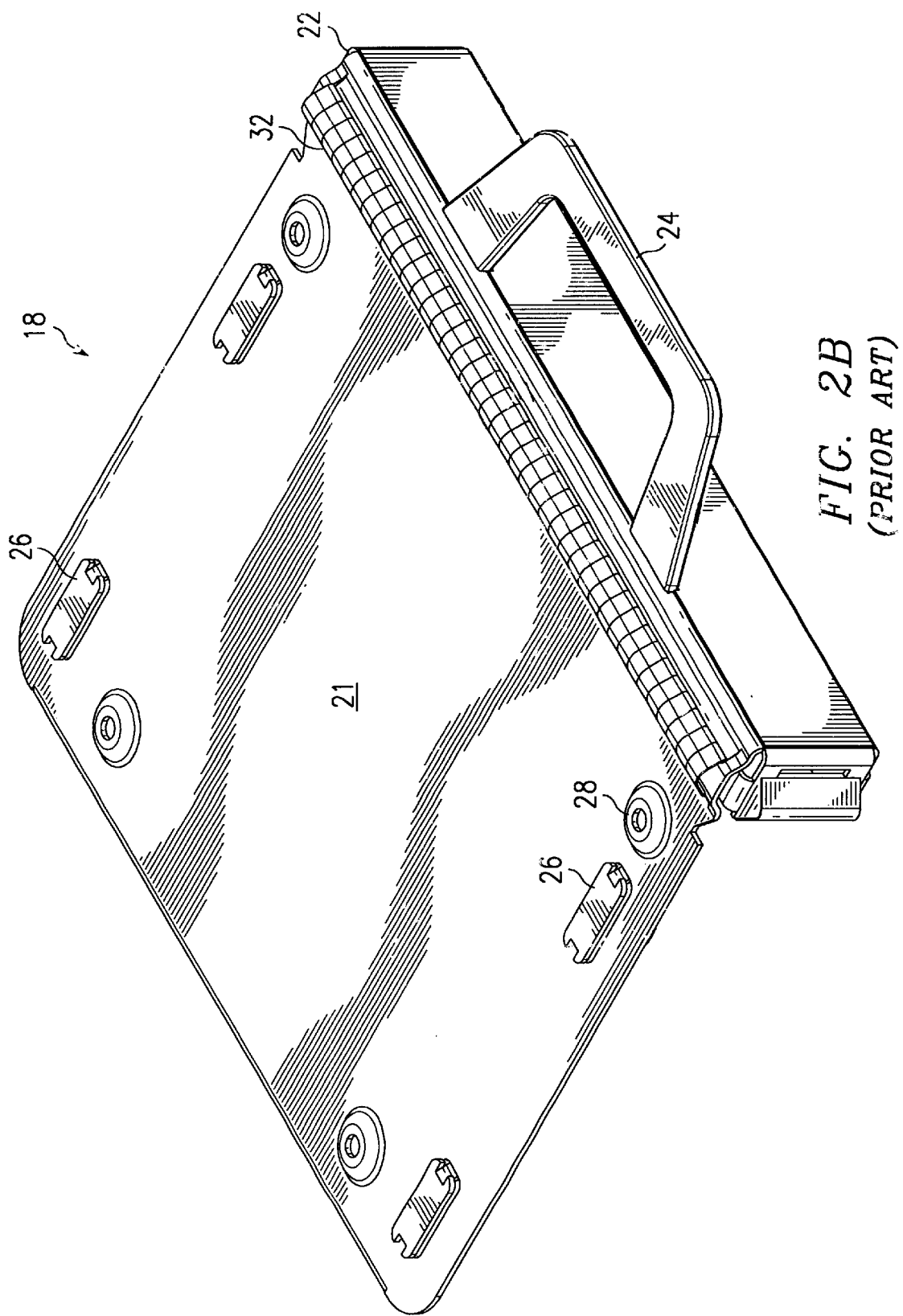
FIG. 2B is an isometric drawing of the faceplate of FIG. 2A, showing a second side of the faceplate.

Conventionally, the addition of handle 16 to cardholder 14 requires handle hardware (not explicitly shown in FIG. 1), additional space on front portion 15 of faceplate 14, and additional cost associated with the labor to make and attach handle 16. According to the teachings of the invention, such problems are addressed by forming handle 16 integral with modular cardholder 14 by, in this embodiment, cutting the handle from body portion 17 and bending it back to the desired position. Additional details of such formation and the resulting modular cardholder with an integral handle are described with reference to FIGS. 2A–5. FIGS. 2A and 2B illustrate a conventional cardholder, and FIGS. 3A–4B illustrate a cardholder according to the teachings of the invention during various stages of manufacture. FIG. 5 illustrates a method for forming the modular cardholder with an integral handle.

FIG. 2A is an isometric diagram of a conventional cardholder 18 constructed according to conventional techniques, showing a first side 19 of the faceplate. Conventional modular cardholder 18 includes a body portion 20 and a front portion 22. Front portion 22 may be formed from a workpiece integral with body portion 20. A handle 24 is attached to front portion 22. Connectors 30 are used to attach handle 24 to front portion 22 through a plurality of apertures 32. Body portion 20 includes a plurality of indentations 26 and 28 for facilitating connection of a printed circuit board to conventional modular cardholder 18. Conventional cardholder 18 also includes a lip portion 34 opposite front portion 22.

FIG. 2B is an isometric drawing of modular face cardholder 18 showing a back side 21 of the cardholder. As shown in this view, modular cardholder 18 also includes an electromagnetic shield 32 for preventing electromagnetic emissions that may emanate from the associated printed circuit board through apertures 32.

As illustrated in FIGS. 2A and 2B, handle 24 is formed separately from body portions 20 and front portion 22 and attached with hardware 30 to body portion 20. In contrast, according to the teachings of the invention, a handle is formed integral with the corresponding body portions and front portions of a modular cardholder as illustrated in FIGS. 3A through 4B.

Figure 3A:
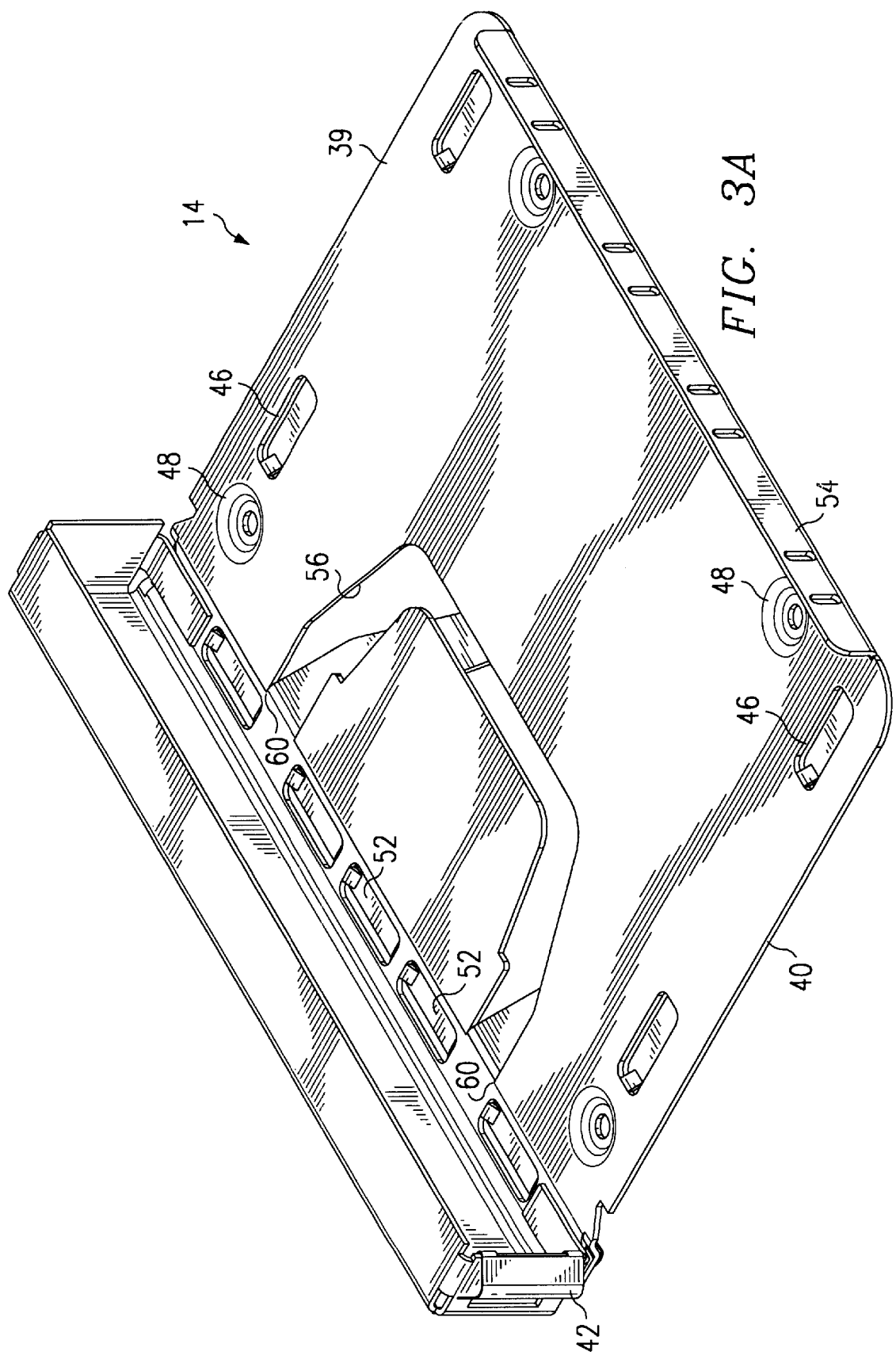
FIG. 3A is an isometric drawing of one side of one of the modular cardholders of FIG. 1 during an initial stage of construction according to the teachings of the present invention, showing the initial formation of a handle.
Figure 3B:
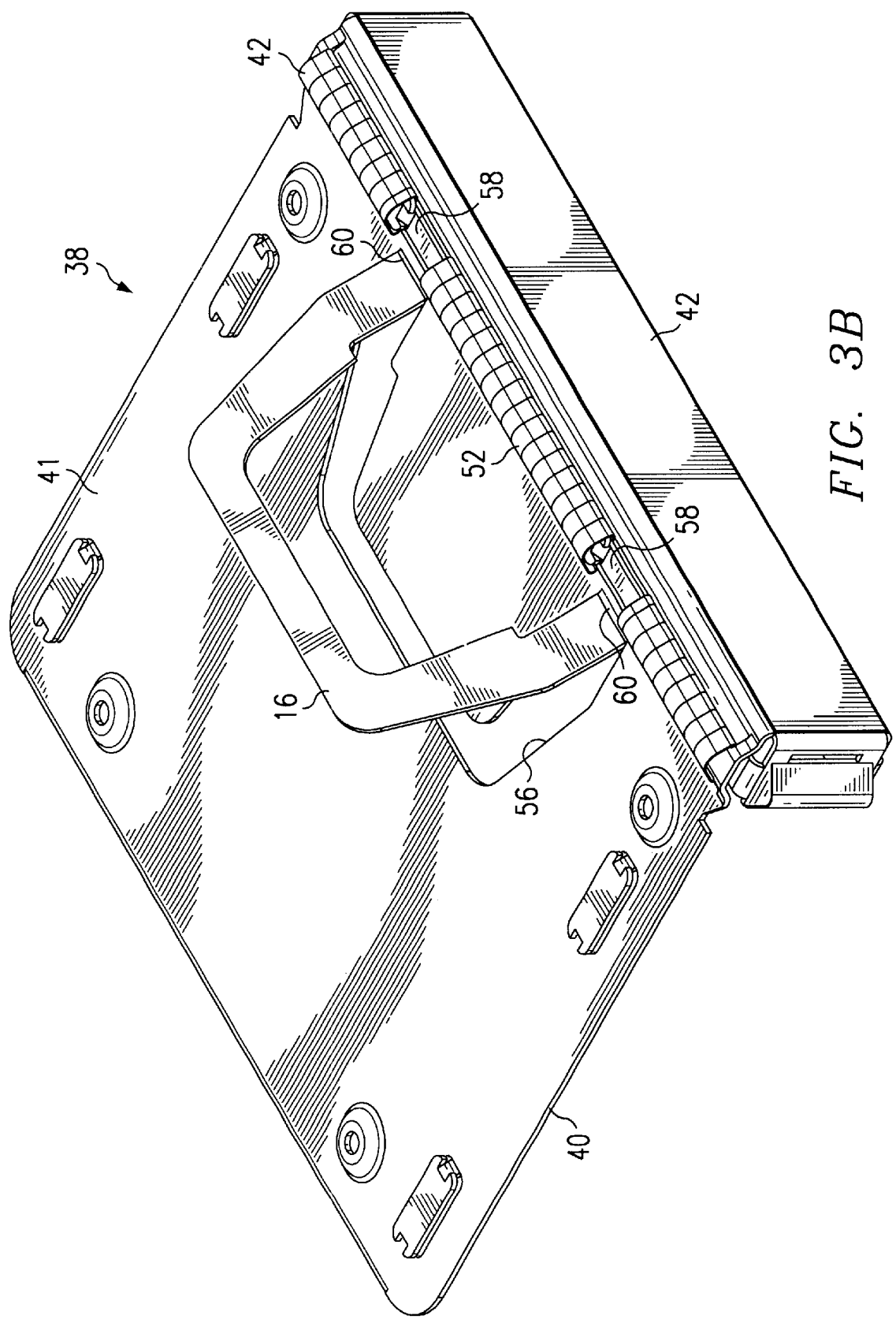
FIG. 3B is a schematic diagram of the modular cardholder of FIG. 3A, showing a back side of the cardholder.

FIG. 3A is an isometric drawing of one of the modular cardholders 16 constructed according to the teachings of the invention, showing a front side 39, and FIG. 3B is an isometric drawing of the modular cardholder 16 of FIG. 3A showing a back side 41. As illustrated, modular cardholder 14 may be substantially similar to modular cardholder 18, except for the associated handle. Modular cardholder 14 includes a body portion 40 and a front portion 42. In addition, modular cardholder 14 may include a lip portion 54 disposed opposite the front portion 42.

Body portion 40 may include a plurality of indentations 46 and 48 for facilitating connection of an associated printed circuit board. In addition, modular cardholder 14 may include a plurality of apertures 52, as is the case with conventional modular cardholder 18; however, such apertures are not needed to secure a handle to modular cardholder 14 and may be eliminated if not needed for other reasons. This provides one advantage of the present invention because the elimination of apertures 52 reduces electromagnetic discharge from the associated printed circuit board from escaping chassis 10. Body portion 40 and front portion 42 may be formed from a single workpiece. In one embodiment, the workpiece is sheet metal; however, the workpiece may be formed from other materials. Furthermore, if desired, front portion 42 may not be formed integral with body portion, but rather formed separately and attached with suitable hardware.

According to the teachings of the invention, a handle 16 (shown best in FIG. 3B) is cut from body portion 40 leaving a handle-shaped aperture 56 in body portion 40. Handle 16 may be cut by hand, by laser, with a stamp, or by any other suitable method. Handle 16 is then bent along lines 60 to a desired position for use. Handle 16 may be bent into a desired position by hand, by press, or through any other suitable method. Such cutting and bending of handle 16 may occur after formation of front portion 22, as shown, or before formation of front portion 22.

FIG. 3B shows handle 16 in an intermediate position moving from body portion 40 to a desired position that in one embodiment is approximately 180° from body portion 4. Also illustrated in FIG. 3B are gaps 58 formed in an electromagnetic shield 52 to allow handle 16 to bend to a position substantially parallel to, but 180° rotated from, body portion 16. The formed cardholder 16 is illustrated in FIGS. 4A and 4B. As shown, handle 16 reaches a position substantially parallel to body portion 40 but approximately 180° from its initial position.

Thus, according to the teachings of the invention, a simple and economical manner for forming a modular cardholder with a handle is provided. Such formation reduces construction cost and, in some embodiments, may reduce any resulting electromagnetic interference by the associated printed circuit board. A method for forming such a handle is described in connection with FIG. 5.

FIG. 5 is a flowchart showing a method for forming a modular cardholder according to the teachings of the invention. The method begins at step 100. At a step 102, a workpiece is provided. The workpiece may be a flat sheet of sheet-metal. Alternatively, the workpiece may be a flat sheet of aluminum or other material, or may take other suitable forms. At a step 104, a handle is formed in body portion of the workpiece. Step 104 of forming the handle may include cutting the handle by hand, stamping the handle, cutting the handle with a laser, or through other suitable techniques. At a step 106 the handle is bent into the desired position. According to one embodiment, the desired position is approximately 180° from the original unbent position of the handle; however, other desired positions may be utilized. Step 106 of bending the handle into position may be performed automatically, through a press, performed by hand, or other suitable techniques.

At a step 108 the remainder of the cardholder is formed. Such a step may include forming a front portion, such as front portion 42, forming a plurality of indentations for facilitating attachment to a printed circuit board, and providing electromagnetic shielding where appropriate. Alternatively, many if not all of the steps associated with step 108 may be performed before formation or bending of the handle. The method concludes at step 110.

Although the present invention and its advantages have been described in detail, it should be understood that various changes, substitutions, and alterations can be made therein without departing from the spirit and scope of the present invention as defined by the appended claims.

What is claimed is:

1. A telecommunications device comprising:
   a chassis having a plurality of slots;
   a plurality of cardholders disposed in a one-to-one fashion within the slots, each cardholder affixed in a one-to-one fashion to a printed circuit board; and
   wherein each cardholder comprises:
      a telecommunications modular cardholder comprising:
         a generally rectangular body portion configured to affix to and secure a printed circuit board, the generally rectangular body portion formed from a workpiece and configured to fit in one of the plurality of slots;
         a front end portion at a first end of the body portion, the front end portion being generally rectangular and disposed in a plane generally perpendicular to the body portion; and
         a handle extending from the generally rectangular body portion, the handle formed integral with the body portion and formed from the workpiece, wherein the body portion is formed with an aperture having a shape substantially the same shape of the handle.

2. The telecommunications device of claim 1, wherein the plurality of printed circuit boards and the chassis form a DSLAM.

3. The telecommunications device of claim 1, wherein the workpiece is formed from metal.

4. The telecommunications device of claim 1, wherein the workpiece is formed from sheet metal.

5. The telecommunications device of claim 1, wherein the handle has a thickness the same as the thickness of the body portion.

6. The telecommunications device of claim 1, and further comprising an electromagnetic shield covering a plurality of apertures in the body portion.

7. A telecommunications modular cardholder comprising:
   a generally rectangular body portion configured to affix to and secure a printed circuit board, the generally rectangular body portion formed from a workpiece and configured to fit in a slot;
   a front end portion formed at a first end of the body portion, the front end portion being generally rectangular and disposed in a plane generally perpendicular to the body portion; and
   a handle extending from the generally rectangular body portion, the handle formed integral with the body portion and formed from the workpiece, wherein the body portion is formed with an aperture having a shape substantially the same as the shape of the handle.

8. The telecommunications cardholder holder of claim 7, wherein the workpiece is formed from metal.

9. The telecommunications cardholder holder of claim 7, wherein the workpiece is formed from sheet metal.

10. The telecommunications cardholder holder of claim 7, wherein the body portion and the front end portion each have a height of between six and twenty-four inches.

11. The telecommunications cardholder holder of claim 7, wherein the handle has a thickness the same as the thickness of the body portion.

12. The modular cardholder of claim 7, wherein the handle is painted.

13. The modular cardholder of claim 7, wherein the generally rectangular body portion has a height of approximately seven inches and a width of approximately five inches.

14. The telecommunications modular cardholder of claim 7, and further comprising an electromagnetic shield covering a plurality of apertures in the body portion.

15. A telecommunications modular cardholder comprising:
   a body portion means for holding a printed circuit board, the body portion means formed from a workpiece;
   a front end portion means formed at a first end of the body portion means, the front end portion being generally rectangular and disposed in a plane generally perpendicular to the body portion; and
   a handle means formed integral with the body portion means, the handle formed from the workpiece, wherein the body portion means is formed with an aperture having a shape substantially the same as the shape of the handle means.

16. A method for forming a telecommunications modular cardholder comprising:
   providing a workpiece having a front portion and a body portion;
   forming a handle from the body portion;
   bending the workpiece into the general form of a modular faceplate having the front portion and the body portion; and
   bending the handle from the body portion of the workpiece to a position substantially perpendicular to the front portion and approximately 180 degrees from its unbent position.

17. The method of claim 16, wherein bending the workpiece into the general form of a faceplate comprising bending the workpiece into the general form of a faceplate before forming the handle from the body portion.

18. The method of claim 16, wherein bending the workpiece into the general form of a faceplate comprising bending the workpiece into the general form of a faceplate after forming the handle from the body portion.

19. The method of claim 16, wherein forming a handle from the body portion comprises stamping the handle from the body portion.

20. The method of claim 16, wherein the workpiece comprises metal.

21. The method of claim 16, wherein the workpiece comprises sheet metal.

22. The method of claim 16, wherein forming a handle from the body portion comprises cutting the handle in the body portion.

23. The method of claim 22, wherein cutting the handle in the body portion comprises cutting the handle in the body portion with a laser.

24. The method of claim 16, wherein bending the handle comprises bending the handle with a press.

25. The method of claim 16, wherein bending the handle comprises bending the handle by hand.

26. A method for forming a telecommunication modular face plate comprising:
   providing a generally flat workpiece;
   cutting a handle in the workpiece while leaving the handle attached to the workpiece;
   forming a front portion from the workpiece, the front portion substantially perpendicular to a body portion of the workpiece, the front portion and the body portion of the workpiece forming a modular face plate; and
   bending the handle with respect to the workpiece and the front portion to form a handle facing a desired direction.

* * * * *